United States Patent
Levin et al.

(10) Patent No.: US 12,261,724 B2
(45) Date of Patent: Mar. 25, 2025

(54) SERDES CIRCUIT AUTOMATIC GAIN CONTROL AND CONVERGENCE

(71) Applicant: Intel Corporation, Santa Clara, CA (US)

(72) Inventors: Itamar Levin, Holon (IL); Tali Warshavsky, Ramat Gan (IL)

(73) Assignee: Intel Corporation, Santa Clara, CA (US)

( * ) Notice: Subject to any disclaimer, the term of this patent is extended or adjusted under 35 U.S.C. 154(b) by 671 days.

(21) Appl. No.: 17/484,205

(22) Filed: Sep. 24, 2021

(65) Prior Publication Data

US 2023/0100177 A1 Mar. 30, 2023

(51) Int. Cl.
  *H04L 25/03* (2006.01)
  *G06F 13/42* (2006.01)
  *H03G 3/30* (2006.01)
  *H04B 1/16* (2006.01)

(52) U.S. Cl.
  CPC .... *H04L 25/03885* (2013.01); *G06F 13/4221* (2013.01); *H03G 3/30* (2013.01); *H04B 1/16* (2013.01); *G06F 2213/0026* (2013.01)

(58) Field of Classification Search
  CPC . H04B 1/16; H04L 25/03885; G06F 13/4221; G06G 2213/0026; H03G 3/30; H03G 3/3078
  See application file for complete search history.

(56) References Cited

U.S. PATENT DOCUMENTS

| 8,837,570 | B2* | 9/2014 | Shvydun | H04L 25/03885 |
| | | | | 375/233 |
| 9,565,037 | B1* | 2/2017 | Liu | H04L 25/03057 |
| 2015/0110165 | A1* | 4/2015 | Ramadoss | H04L 25/03343 |
| | | | | 375/232 |
| 2015/0381393 | A1* | 12/2015 | Kotagiri | H04L 7/033 |
| | | | | 375/233 |

* cited by examiner

*Primary Examiner* — Dac V Ha
(74) *Attorney, Agent, or Firm* — Schwegman Lundberg & Woessner, P.A.

(57) ABSTRACT

An Automatic Gain Control (AGC) SERDES circuit may be used to provide improved gain control for SERDES operation. This AGC SERDES circuit uses an initial gain convergence to determine and store an initial gain level. Once the initial gain convergence is complete, the AGC SERDES circuit uses a signal peak tracking to reduce or prevent saturation events. By setting the gain target based on tracked changes in the equalizer coefficients, the AGC SERDES circuit adapts the gain target to reduce or prevent saturation events and provide the improved communication throughput. A SERDES receiver circuit also provides improved performance using an improved convergence flow within its subcomponent blocks. The improved convergence flow also provides the ability to track environmental changes, voltage changes, and changes to input parameters, and can be performed while data is running on the link to provide continuously improved communication channel performance.

25 Claims, 9 Drawing Sheets

SERDES CIRCUIT AUTOMATIC GAIN CONTROL AND CONVERGENCE

TECHNICAL FIELD

Embodiments described herein pertain to integrated circuit (IC) devices and systems. Some embodiments relate to Serializer/Deserializer (SERDES) designs for IC devices and systems.

BACKGROUND

SERDES circuits are used in IC devices and systems to convert data bidirectionally between a parallel interface and a serial interface. SERDES circuits are often used in high-speed input/output (I/O) communications. SERDES circuits may rely on gain control to drive the average amplitude of an output signal to a desired value. However, gain control may result in signal clipping, digital equalization errors, reduced achievable signal-to-noise ratio (SNR) and excessive bit error events. SERDES circuits may include subcomponent blocks (e.g., circuit blocks) to provide gain control or other features. However, these subcomponent blocks may influence or interfere with other subcomponent blocks.

DETAILED DESCRIPTION

Figure 1:
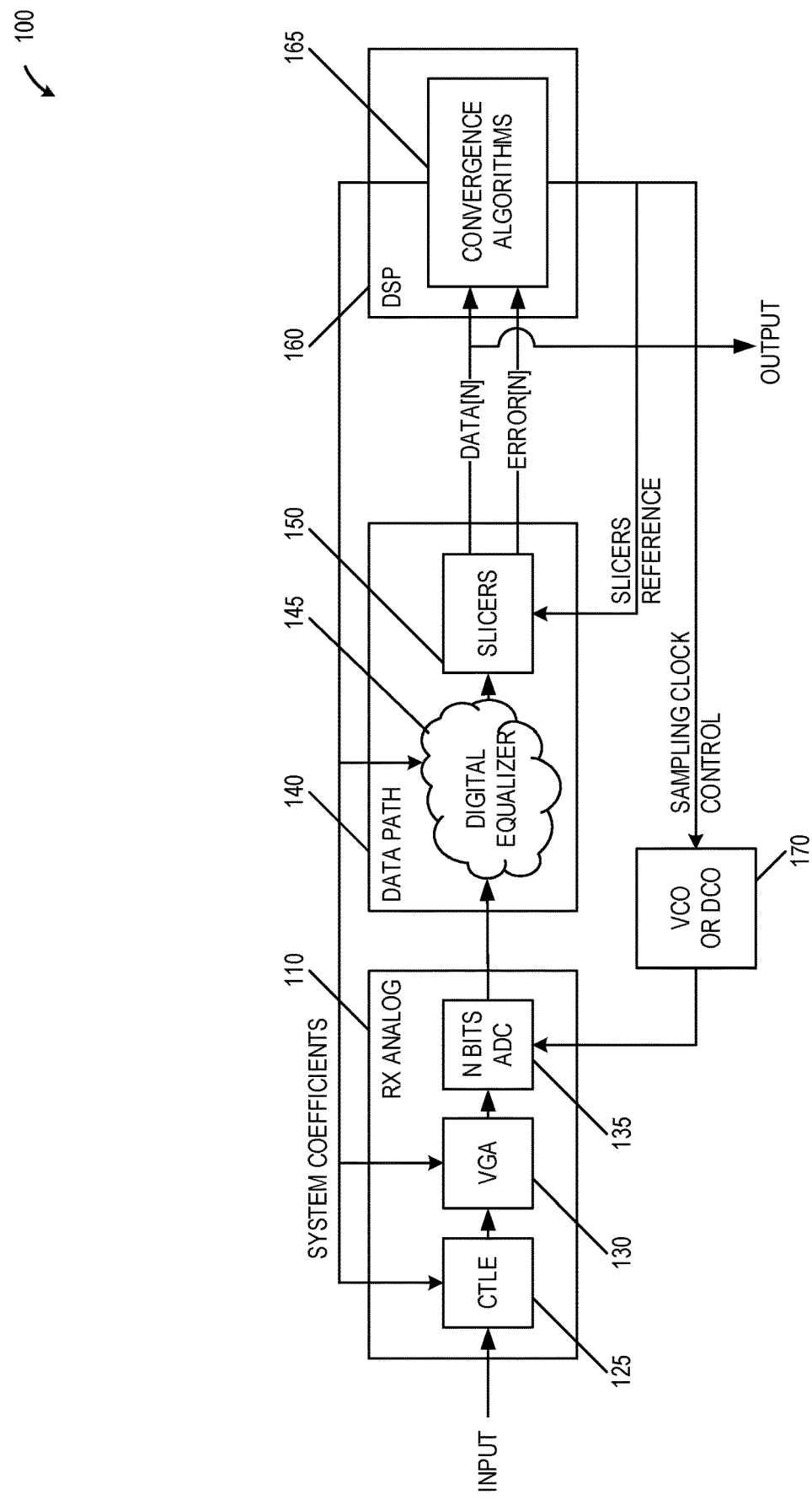
FIG. 1 shows a high-level architecture of a SERDES with an AGC (Automatic Gain Control) circuit, according to some embodiments described herein.

An Automatic Gain Control (AGC) circuit in a SERDES circuit may be used to provide improved gain control for SERDES receiver operation. This SERDES receiver with an AGC circuit provides improved communication throughput for high-speed (e.g., at least 16 Gbps) communication applications for complex intersymbol interference (ISI) communication channels, such as Peripheral Component Interconnect Express (PCIe) 4.0 and beyond, and Ethernet 50 Gbps and beyond. This AGC SERDES circuit may include an AGC circuit to control the gain of front-end analog signal conditioning circuits, such as a continuous time linear equalizer (CTLE) and a variable gain amplifier (VGA). This AGC SERDES circuit may include an analog-to-digital-converter (ADC) circuit, a digital equalizer (e.g., feed-forward equalizer (FFE), decision feedback equalizer (DFE)), a digital data slicer, and subsequent digital signal processing (DSP) circuit to improve equalization in the presence of ISI. These SERDES circuits provide improvements to the receiver side of the SERDES (e.g., the De-Serializer), and "SERDES circuit" is used herein to refer to the SERDES receiver.

This AGC SERDES circuit uses an initial gain convergence to determine and store an initial gain level. This initial convergence may be accomplished using a least means squared (LMS)-based AGC circuit while adjusting a gain level. This initial convergence may also be accomplished by starting the tuning from an initial high-gain setting and reducing the AGC gain until a number of saturation events at the output of the ADC circuit is reduced to an acceptable range. Once the initial gain convergence is complete, the AGC SERDES circuit uses a signal peak tracking to reduce or prevent saturation events. In particular, the AGC SERDES circuit calculates a signal peak based on SERDES circuit equalizer coefficients, the equalizer coefficient are used to monitor the channel ISI, and the gain target is set based on the calculated signal peak to prevent saturation events. By setting the gain target based on tracked changes in the equalizer coefficients, the AGC SERDES circuit adapts the gain target to reduce or prevent saturation events and provide the improved communication throughput.

A SERDES receiver circuit also provides improved performance using an improved convergence flow within its subcomponent blocks, such as in the CTLE, VGA, ADC, or equalizer. This convergence flow includes seven ordered states: 1. Reference clock lock; 2. Clock/Data Recovery (CDR) lock on data; 3. Transmission feed-forward equalizer (TX FFE) training; 4. Receiver equalizer (e.g., RX FFE, RX DFE) training; 5. Tail FFE location search; 6. Tail FFE training; and 7. End flow state upon establishment of stable link. In state 7, the communication link is established while slow parameter tracking continues, which maintains the communication link and tracks environmental conditions and drifts.

This AGC SERDES circuit provides various advantages over other solutions. By using an initial gain convergence and subsequent signal peak tracking, the SERDES circuit does not require pre-characterization of a communication channel, saturation event thresholds may be set very low (e.g., zero saturation events), dynamic adaptation and tracking are used to reduce or eliminate channel variation effects (e.g., temperature-induced channel drift, humidity-induced channel drift), and ignoring rare ISI peaking events that do not affect BER. Because this AGC SERDES circuit solution uses equalizer coefficients that are already accessible in the system hardware or firmware, this SERDES circuit also provides a lightweight solution that may be implemented in hardware or firmware without significant silicon area or central processing unit (CPU) burden. The improved convergence flow also provides the ability to track environmental changes, voltage changes, and changes to input parameters, and can be performed while data is running on the link to provide continuously improved communication channel performance. Additional improvements and benefits are described below with reference to FIG. 1 through FIG. 9.

FIG. 1 shows a high-level architecture of a SERDES with an AGC circuit 100, according to some embodiments described herein. SERDES circuit with an AGC circuit 100 receives an analog input signal X(t) at a CTLE circuit 125 within analog receiver circuit group 110. The CTLE circuit 125 may function as the first equalization stage in the receiver. The received analog input signal is pre-conditioned by the CTLE circuit 125, which generates a CTLE signal based on the received analog input signal. The CTLE signal is further amplified within a VGA circuit 130 to generate a VGA signal, and an analog-to-digital conversion (ADC) circuit 135 samples the VGA signal to produce an ADC digital signal.

The ADC digital signal is provided from the analog receiver circuit group 110 to a digitally controlled equalizer circuit 145 within the data path circuit group 140. The digitally controlled equalizer circuit 145 may include one or more of a feed-forward equalizer (FFE) and a decision feedback equalizer (DFE). The digitally controlled equalizer circuit 145 generates a digitally equalized signal by equalizing the ADC digital signal to reduce the remaining ISI. The digitally equalized signal is then fed as a slicer input to slicers 150 to generate a sliced data stream DATA(N) (e.g., pulse-amplitude modulation 4.0 (PAM4)={−3, −1, 1, 3}, non-return-to-zero (NRZ)={−1, 1}, etc.), and to generate a cursor error stream (e.g., sliced error stream, unsliced error stream) ERROR(N) based on the difference between the sliced data stream DATA(N) and the digitally equalized signal slicer input.

The sliced data stream and an error stream are then provided to convergence algorithms 165 within a digital signal processing (DSP) circuit group 160 to generate a converged data stream output. The convergence algorithms 165 generate system coefficients to tune or otherwise improve the performance of SERDES circuit with an AGC circuit 100, such as providing system coefficients to the CTLE circuit 125, the VGA circuit 130, and the digitally controlled equalizer circuit 145. The convergence algorithms 165 may also provide a slicers reference signal to slicers 150, and may provide a sampling clock control signal to a voltage-controlled oscillator (VCO) or digitally controlled oscillator (DCO) circuit 170 whose output frequency and signal edges are used by the ADC circuit 135. While the SERDES circuits with AGCs are described herein with respect to ADC-based receivers, they may also be used to improve communication throughput of analog receivers that do not include an ADC, such as in analog SERDES where the digitally controlled equalizer circuit 145 (e.g., DFE, FFE) may be part of the analog receiver circuit group 110. These SERDES circuits with AGCs may also be implemented with analog and digital equalization, in which one or more digitally controlled equalizer circuits 145 may be implemented in the analog receiver circuit group 110 and the data path circuit group 140.

Figure 2:
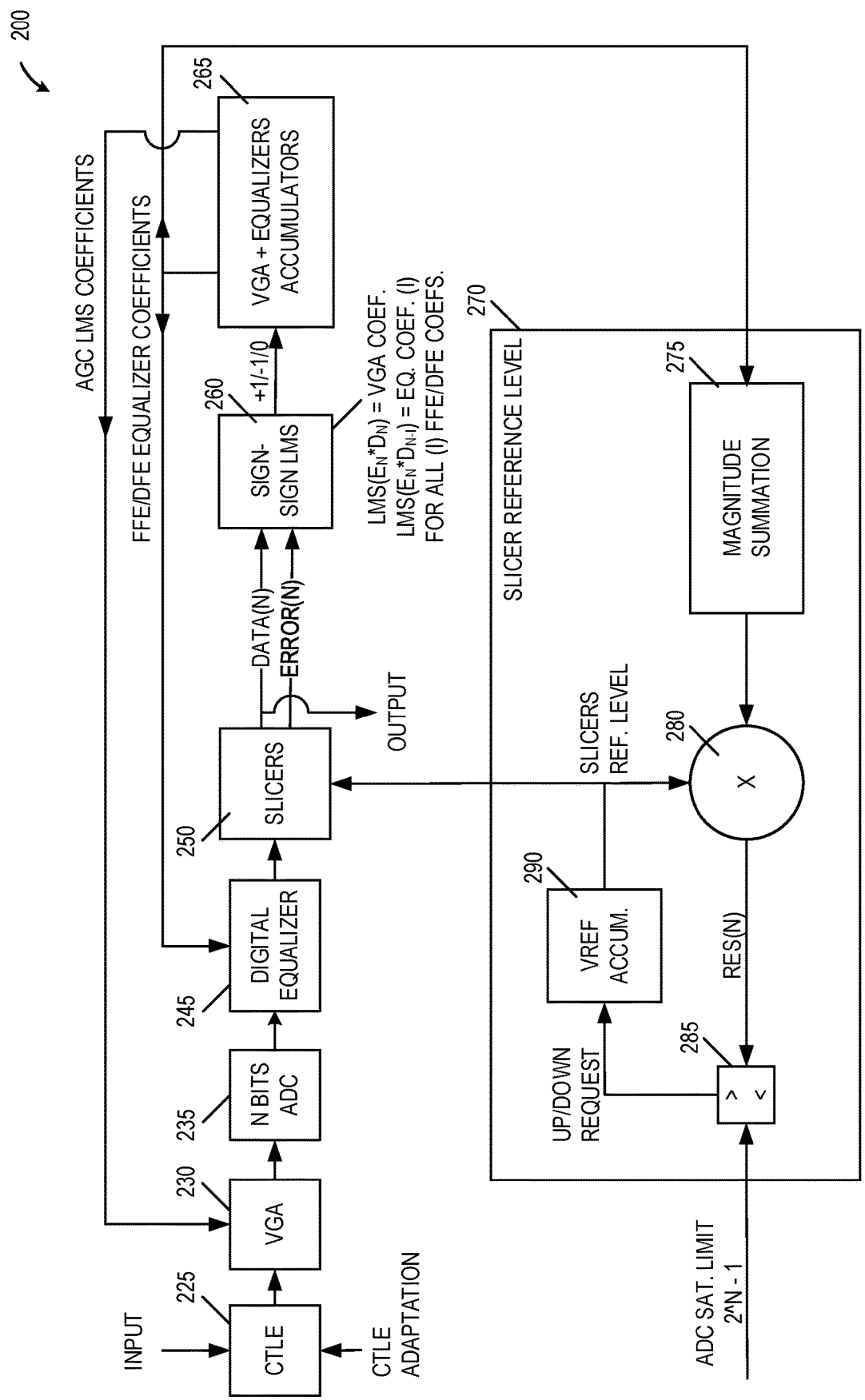
FIG. 2 shows an architecture of a AGC SERDES circuit, according to some embodiments described herein.

FIG. 2 shows an architecture of a AGC SERDES circuit 200, according to some embodiments described herein. AGC SERDES circuit 200 receives an analog input signal at a CTLE circuit 225. The CTLE circuit 225 generates a CTLE signal based on the received analog input signal. The CTLE signal is amplified within a VGA circuit 230 to generate a VGA signal, and an ADC circuit 235 samples the VGA signal to produce an ADC digital signal. The ADC digital signal is provided to the digital equalizer circuit 245, which generates a digitally equalized signal by equalizing the ADC digital signal. The digitally equalized signal is then fed to slicers 250 to generate a sliced data stream and a sliced error stream.

The sliced data stream and sliced error stream are provided from the slicers 250 to a sign-sign least means squared (LMS) circuit 260. Using the sliced data stream and the sliced error stream, the sign-sign LMS circuit 260 generates coefficient commands (e.g., up (+1) command, down (−1) command, stay (0) command) commands for the FFE/DFE equalizer coefficient and VGA coefficient accumulator circuit 265.

The equalizer and the VGA commands are then provided to a coefficient accumulator circuit 265 to generate converged coefficients. The VGA coefficient is produced by the coefficient accumulator circuit 265 generates automatic gain control (AGC) LMS coefficients that are used within by the VGA circuit 230 to control gain. The equalizer coefficients are produced by the coefficient accumulator circuit 265 to generate equalizer coefficients that are used by digital equalizers 245.

The coefficient accumulator circuit 265 may also provide equalizer coefficients to a magnitude summation circuit 275 within a slicer reference level circuit 270. The magnitude summation circuit 275 is used to generate a coefficient magnitude sum, where the coefficient magnitude sum is based on 1+sum of absolute values of the plurality of equalizer coefficients. A multiplier circuit 280 then generates a multiplier saturation output RES(N) based on the coefficient magnitude sum and a previous slicer level. The multiplier saturation output RES(N) and an ADC saturation limit input is then used by a comparator circuit 285 to generate a saturation prevention request, where the saturation prevention request includes an increase request, a decrease request, or a hold request. The saturation prevention request includes the increase request when the comparator circuit determines the multiplier saturation output is greater than the saturation limit input, include the decrease request when the comparator circuit determines the multiplier saturation output is less than the saturation limit input, or includes the hold request when the comparator circuit determines the multiplier saturation output is substantially equal to the saturation limit input. The saturation prevention request is provided to a reference level accumulator 290 circuit to generate the slicer reference level (e.g., Vref), which is provided to the slicers 250 and back to the multiplier circuit 280 for subsequent multiplier saturation output calculations. The saturation limit may be initialized at the maximum saturation limit (e.g., Vref(0)=$2^N-1$). The equalizer coefficients may be initialized to zero, and the VGA coefficient data stream may be initialized based on mid-range VGA coefficient values.

Figure 3:
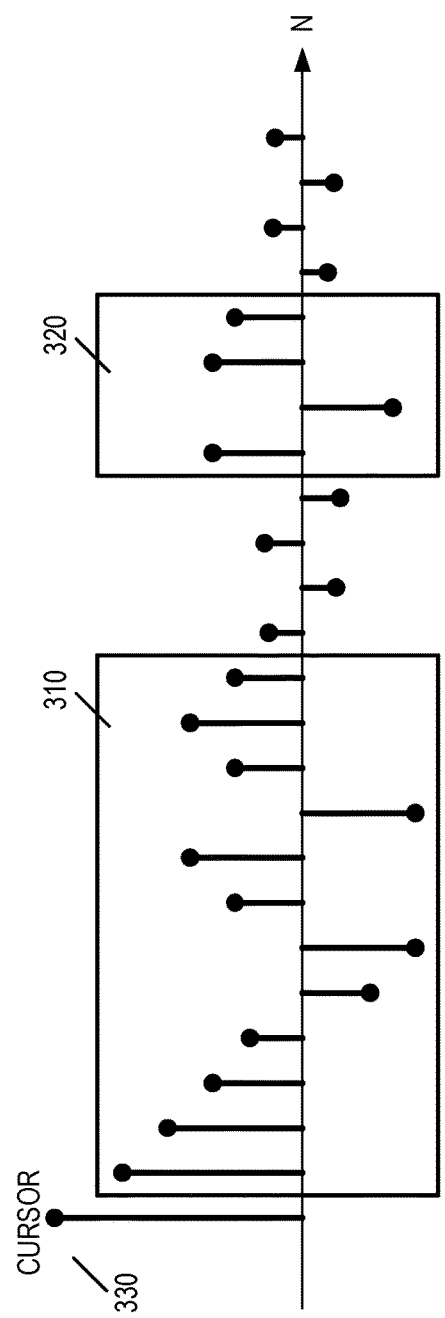
FIG. 3 shows a digital coefficient impulse response plot, according to some embodiments described herein.

FIG. 3 shows a digital coefficient impulse response plot 300, according to some embodiments described herein. Out of the total available equalizer coefficients, the digital coefficient impulse response plot 300 identifies a first group of digital FFE coefficients 310 and a second group of digital FFE coefficients 320 that are sampled, excluding the cursor 330. High-speed SERDES circuits (e.g., 50 Gbps, 100 Gbps, 200 Gbps, or more) may require multiple equalizer taps to meet performance requirements, such as for channels that are difficult to track due to one or more significant ISI events. An ISI event that corresponds to the sum of the absolute value of all the equalizer coefficients may be extremely rare. For example, the probability that a SERDES with 24 FFE taps will generate a worst-case ISI event (e.g., cursor ISI event 330) is $2^{-24}$=5.9e-8. When the SERDES protocol is Ethernet where the bit error rate (BER)<1e-4 is required, such a rare worst-case ISI event may be ignored, as any caused error due to saturation will result in an error rate that is more than three orders of magnitude below the target BER.

A number of coefficient taps may be selected for use within the AGC SERDES circuits described herein based on a target BER. Each exceptional ISI event degrades average SNR and increases BER due to ISI, noise, crosstalk, and jitter. If an AGC SERDES circuit were to consider all ISI, it would result in a reduced average gain and signal level (e.g., SNR) for other data streams that do not include exceptional ISI events. The AGC SERDES circuits may therefore consider ISI events that are of significant probability for a desired BER, such as by using a guard band of one or more orders of magnitude greater than the BER. For example, a 10× guard band may be used with an example target BER of 1e-5, which only considers ISI events that occur with a probability of 1e-6. These 1e-6 probability ISI events include data streams of 20 bits each, with an associated probability of $2^{-20}$=5.9e-7≈1e-6. In this 10× guard band example, the largest 20 equalizer coefficients may be used in the slicer reference level circuit 270 to generate the slicer reference level. The number of coefficients used in generation of the slicer reference level may therefore be selected to use fewer than all available equalizer coefficients, and may be selected based on a target BER. The use of fewer than all available equalizer coefficients provides a higher slicer reference level, provides improved SNR for data streams that do not generate a worst-case ISI event, and therefore reduces the error probability within these data streams. However, the use of fewer than all available equalizer coefficients may result in reduced SNR for any data stream that generates the worst-case ISI.

Figure 4A:
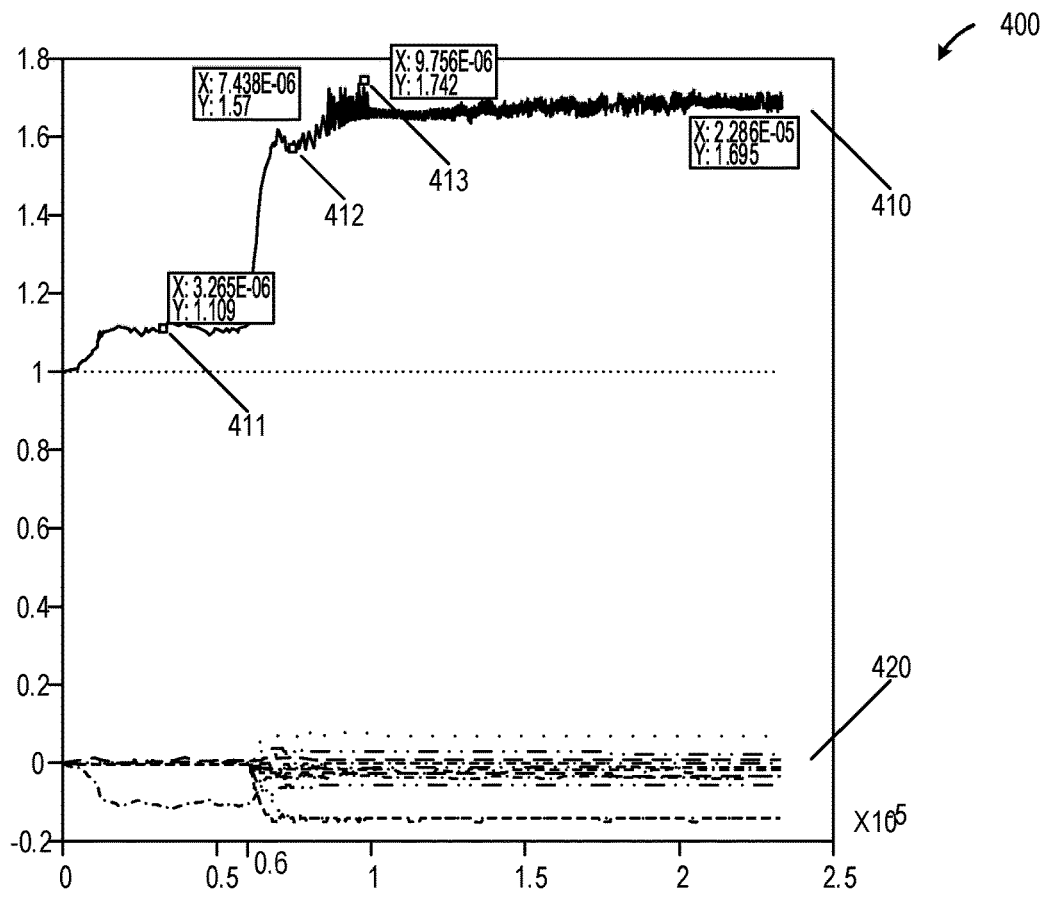
FIGS. 4A-4B show convergence graphs, according to some embodiments described herein.
Figure 4B:
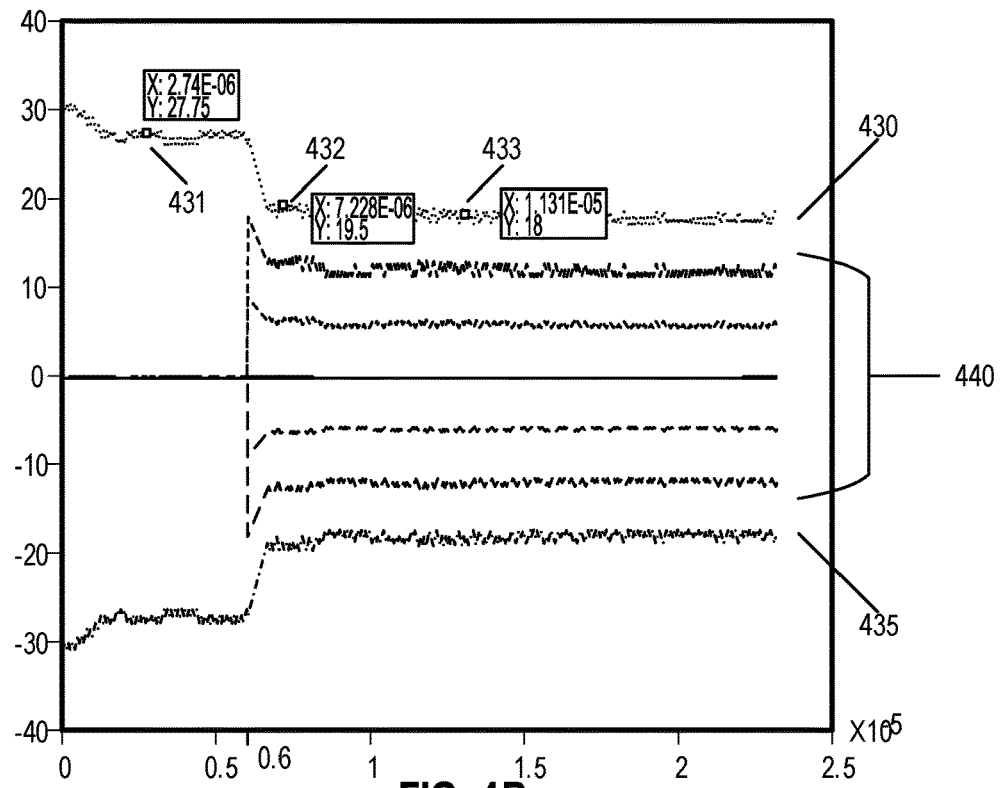

FIGS. 4A-4B show convergence graphs 400, according to some embodiments described herein. Graphs 400 demonstrate the tradeoffs of selecting the number of coefficients for a AGC SERDES circuit. Graphs 400 were generated based on a NRZ and PAM4 constellation Ethernet SERDES. This PAM4 constellation is based on the IEEE 802.3 standard for PAM4, in which a SERDES begins with NRZ encoding with a reduced number of coefficients, then switches to use all coefficients in PAM4 encoding after the signal has improved sufficiently. FIG. 4A shows a coefficient magnitude sum 410, which may be generated by a magnitude summation circuit based on equalizer coefficients 420. FIG. 4B shows converging slicer reference levels 430 and 435 and all PAM4 slicer levels 440, each level generated from the coefficient magnitude sum 410.

Graph 400 was generated based on a 6-bit ADC (e.g., $2^6$=64 levels, +31/−31 levels). The slicer reference level is initialized to 31 (e.g., Vref(0)=$2^5$−1=31), the equalizer coefficients 420 start from zeroed coefficients, and the coefficient magnitude sum 410 is initialized to 1 (e.g., 1+sum(abs (zeroed coefficients))). As shown in FIG. 4A, as the equalizer coefficients 420 start from zeroed coefficients and begin to converge, the coefficient magnitude sum 410 begins to grow. As shown in FIG. 4B, the slicer reference levels 430 and 435 begin to decline at the same time that the coefficient magnitude sum 410 begins to grow. In the example shown in FIG. 4A, the coefficient magnitude sum 410 grows to a coefficient value 411 of 1.109 at t=3.265 μs. This reflects a coefficient magnitude sum of approximately 11%, which results in a corresponding approximate 11% decrease in slicer reference level 430 from 31 to reference value 431 of 27.75 at t=2.74 μs. Around time t=6 μs, PAM4 is enabled and all PAM4 slicer levels 440 begin to converge. Upon enabling PAM4, coefficient magnitude sum 410 increases, such as to coefficient value 412 of 1.57 at t=7.438 μs, then to coefficient value 413 of 1.742 at t=7.756 μs. Slicer reference level 430 continues to decline while coefficient magnitude sum 410 increases, such as declining to reference value 432 of 19.5 at t=7.228 μs (e.g., 31/1.57≈19.5), then to reference value 433 of 18 (e.g., 31/1.74≈18) at t=11.31 μs.

Figure 5:
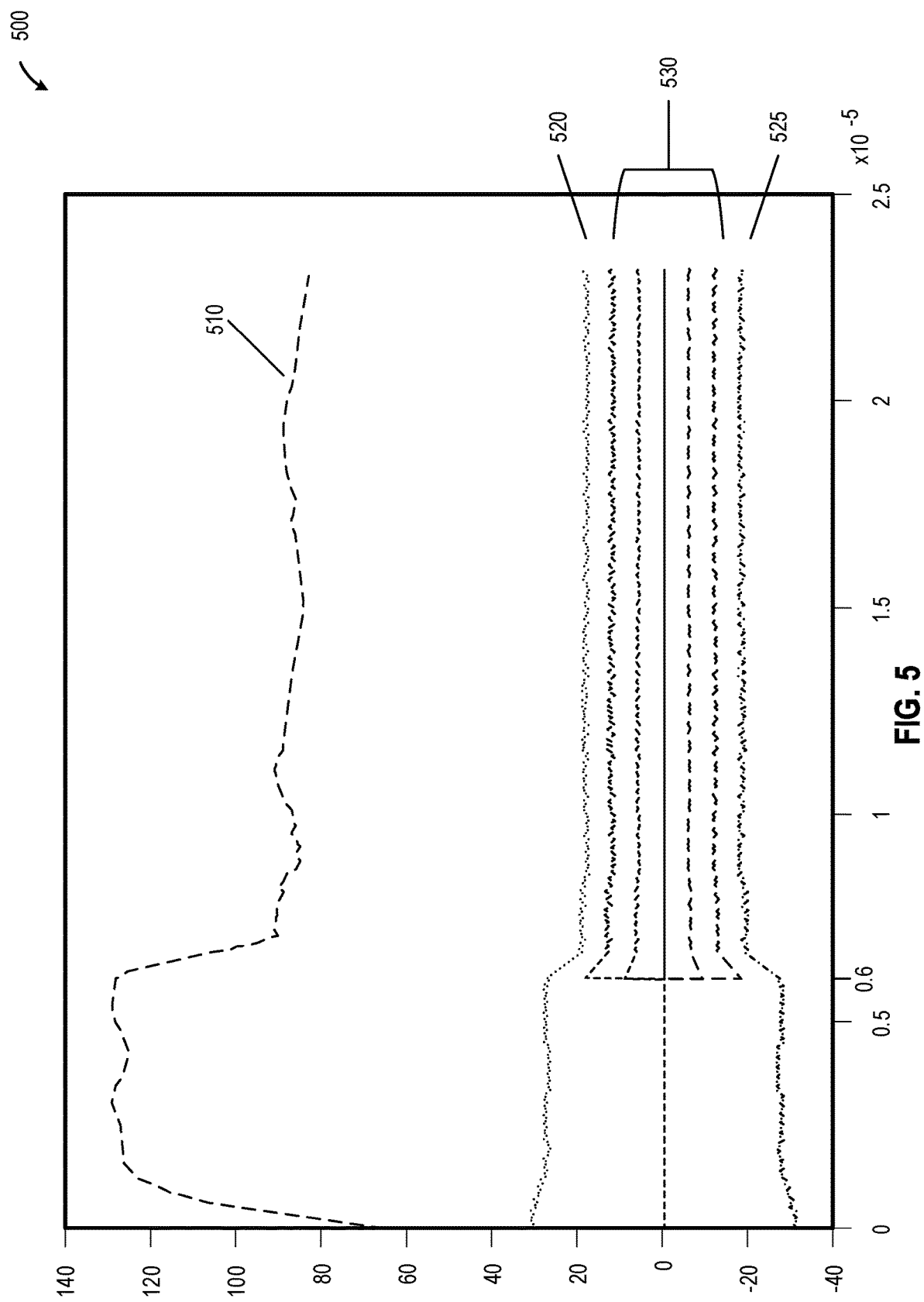
FIG. 5 shows convergence graph, according to some embodiments described herein.
Figure 6A:
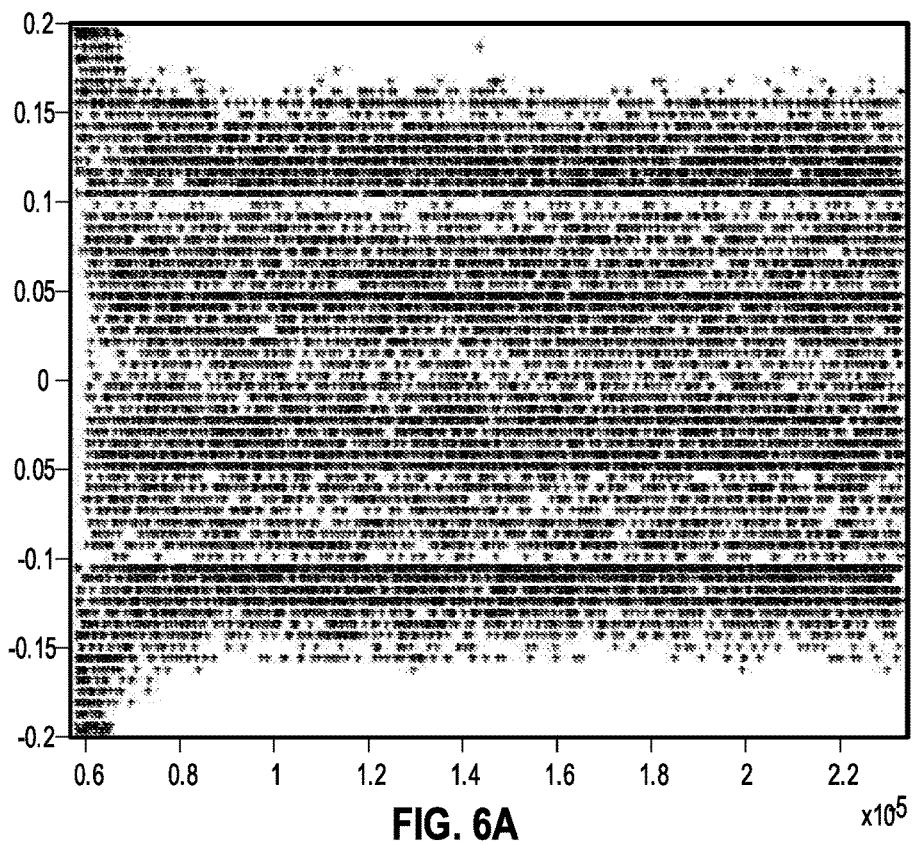
FIGS. 6A-6B show graphs of ADC SERDES output signals before and after equalization, according to some embodiments described herein.

FIG. 5 shows convergence graph 500, according to some embodiments described herein. Convergence graph 500 shows the VGA gain control 510, slicer reference levels 520 and 525, and all slicer (e.g. Vref) levels 530 on a common timeline from 0 μs to 25 μs. In graph 500, the input signal to the SERDES uses NRZ modulation up to time t=6 μs, and switches to PAM4 modulation from time t=6 μs onward. Slicer reference levels 520 and 525 initially remain close to initialized levels, as equalizers coefficients are not fully trained yet and coefficient magnitude sums are low, so VGA gain control 510 initially increases to amplify the signal to match the desired slicer reference levels. In these early stages (e.g., before time t=6 μs where the input signal is NRZ), saturation is probable, as shown in FIG. 6A. At time t=6 μs, PAM4 is activated and all slicer levels 530 channels are used in order to decode the PAM4 symbols. The slicer level reference control (270) reduces slicer reference levels 520 and 525, and VGA gain control 510 and saturation probability is reduced. Each of the slicer reference levels 520 and 525, all slicer levels 530, and the VGA gain control 510 may be accessed through a SERDES application programming interface (API), which may include a customer-accessible graphical user interface (GUI). The behavior of these values, such as VGA gain control 510 behavior and convergence of slicer reference levels 520 and 525 shown in FIG. 5, may be used to confirm the use of or performance improvements provided by the AGC SERDES circuits described herein.

Figure 6B:
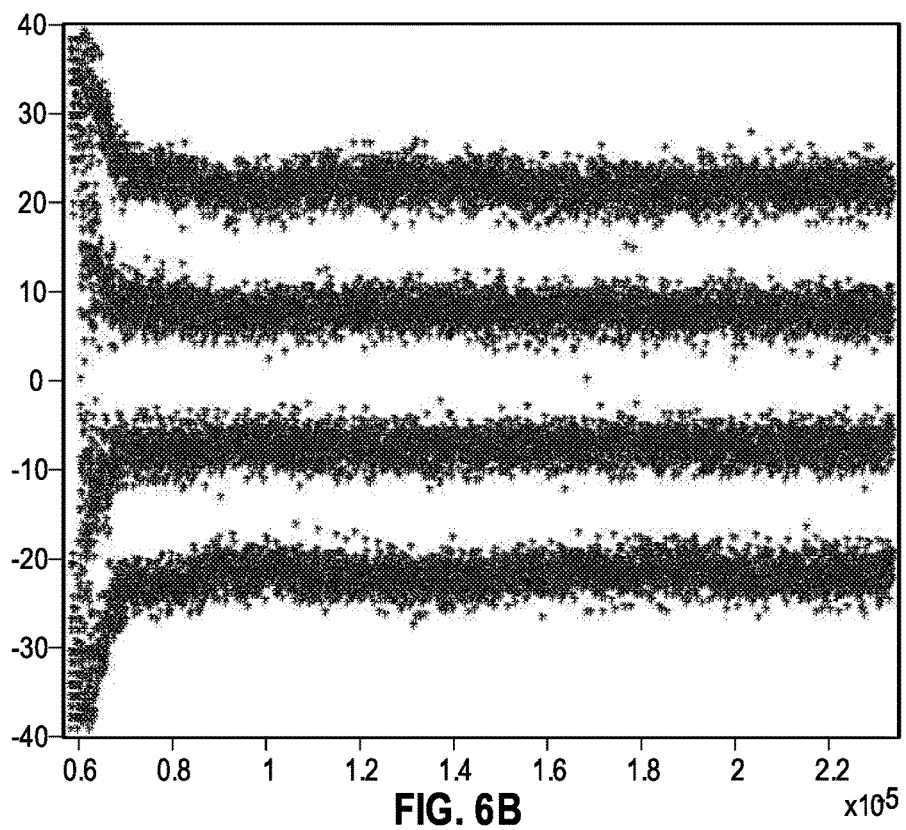

FIGS. 6A-6B graphs 600 of ADC SERDES output signals before and after equalization, according to some embodiments described herein. Graphs 600 show the improvement in channel equalization within an ADC digital signal generated by an ADC circuit, such as by ADC circuit 235 shown in FIG. 2. FIG. 6A shows the ADC digital signal generated by an ADC circuit before digital equalization, and FIG. 6B shows the ADC digital signal after digital equalization. As shown in FIG. 6B, the AGC SERDES circuits described herein provide significant improvement in the ADC digital signal based on improved receiver signal conditioning and equalization. These AGC SERDES circuits also prevent saturation in the unequaled signal, which in turn reduce or eliminate equalization calculation errors and improve equalized signal quality.

Figure 7:
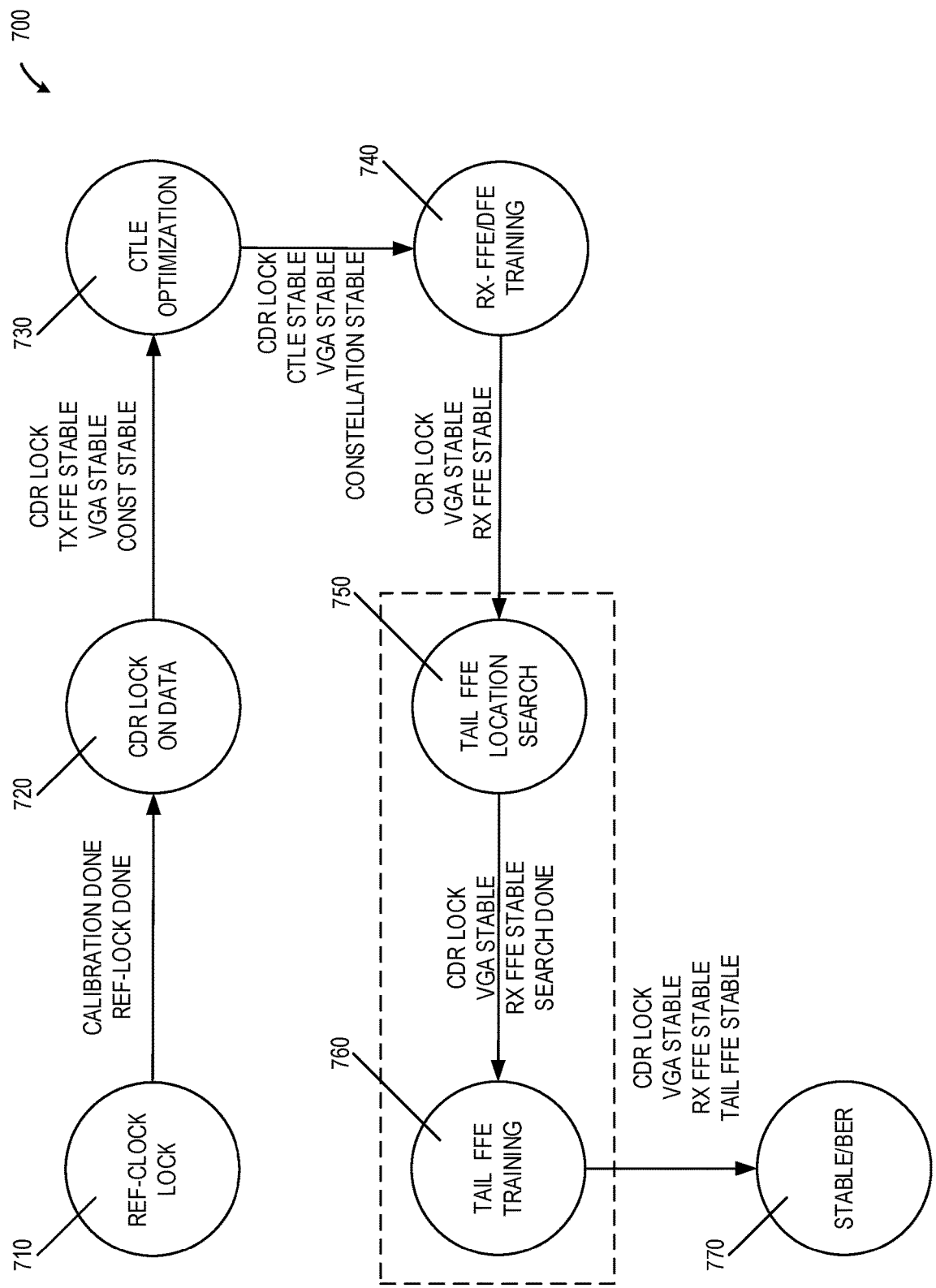
FIG. 7 shows a SERDES communication system convergence flow, according to some embodiments described herein.

FIG. 7 shows a SERDES communication system convergence flow 700, according to some embodiments described herein. Convergence flow 700 improves the convergence result by specifying order and parameters of the convergence processes, and provides a repeatable and robust convergence process. Convergence flow 700 outlines the order and customization (e.g., adaptation speed, loop gain) of seven states of the convergence processes (e.g., state 710 through state 770) for various system blocks within AGC SERDES circuits. These states include state 710: reference clock lock; state 720: clock and data recovery (CDR) lock on data; state 730: transmission feed-forward equalizer (TX FFE) training; state 740: receiver equalizer (e.g., RX FFE, RX DFE) training; state 750: tail FFE location search; state 760: tail FFE training; and state 770: end flow state upon establishment of stable link. FIG. 7 indicates the states names and conditions for transition from state to state. Sub-algorithms that are activated within each state are shown in Table 1, below:

TABLE 1

Convergence Flow States and Active Algorithms Per State

| State | State name | State active flows |
|---|---|---|
| 710 | Ref-clock lock | CDR in PLL mode, VGA, Constellation, Offset Cancellation (OFC) |
| 720 | CDR data lock | CDR, TX FFE, VGA, Constellation, OFC |
| 730 | CTLE Optimization | CDR, CTLE, VGA, Constellation, OFC |
| 740 | RX-FFE/DFE Training | CDR, RX FFE/DFE, VGA, Constellation, OFC |

TABLE 1-continued

Convergence Flow States and Active Algorithms Per State

| State | State name | State active flows |
|---|---|---|
| 750 | Tail FFE Loc. Search | Tail FFE Search algorithm |
| 760 | Tail FFE Training | CDR, RX FFE/DFE, Tail RX FFE/DFE, CDR, VGA, Constellation, OFC |
| 770 | Stable/BER | CDR, RX FFE/DFE, Tail RX FFE/DFE, CDR, VGA, Constellation, OFC in low gain (tracking) mode |

Convergence flow 700 begins with initial state 710, in which a clock is generated for the receiver. Because the receiver performance is unknown in initial state 710, the receiver is not used to extract reliable clock information, and instead a receiver side sampling clock is generated based on a reference clock. The reference clock timebase may deviate from the input signal timebase by a few hundred parts per million (PPM), which may be dictated such as indicated by a relevant standard (e.g., IEEE 802.3, PCIe, International Telecommunication Union (ITU), Common Public Radio Interface (CPRI), etc.). Calibrations are completed for the analog receiver front-end and ADC or slicers, including offset cancellation, initial signaling constellation adjustment, and a selection of VGA initial gain. Each of these operations may be performed by sub-algorithms that are enabled in initial state 710. Because CDR is not locked to the incoming signal, equalization is not adapted in initial state 710, so no assessment of ISI levels is performed. The VGA, OFC, and constellation adaptation remain active from this initial state 710 onwards, so these algorithms react to changes in the signal as CDR lock and equalization are achieved, as equalization changes the envelope of the signal and affects the gain of the system. Initial state 710 also includes compensation of environmental conditions (e.g., temperature) and system gain, as these affect the offset of the analog circuits. When the calibration is complete and the reference clock is locked, state 710 transitions to state 720.

In state 720, the CDR is transitioned into lock-on-data mode, in which the CDR attempts to recover and lock onto the incoming signal timebase. To enable CDR lock in state 720, the CDR clock recovery loop is enabled and the TX FFE and TX amplitude tuning are enabled, such as to avoid RX frontend saturation. The CDR lock occurs when the incoming signal eye is open enough and BER is low enough for capture and lock, such as for BER<$10^{-2}$. Additional requirements are discussed with respect to FIG. 8 described below.

Figure 8:
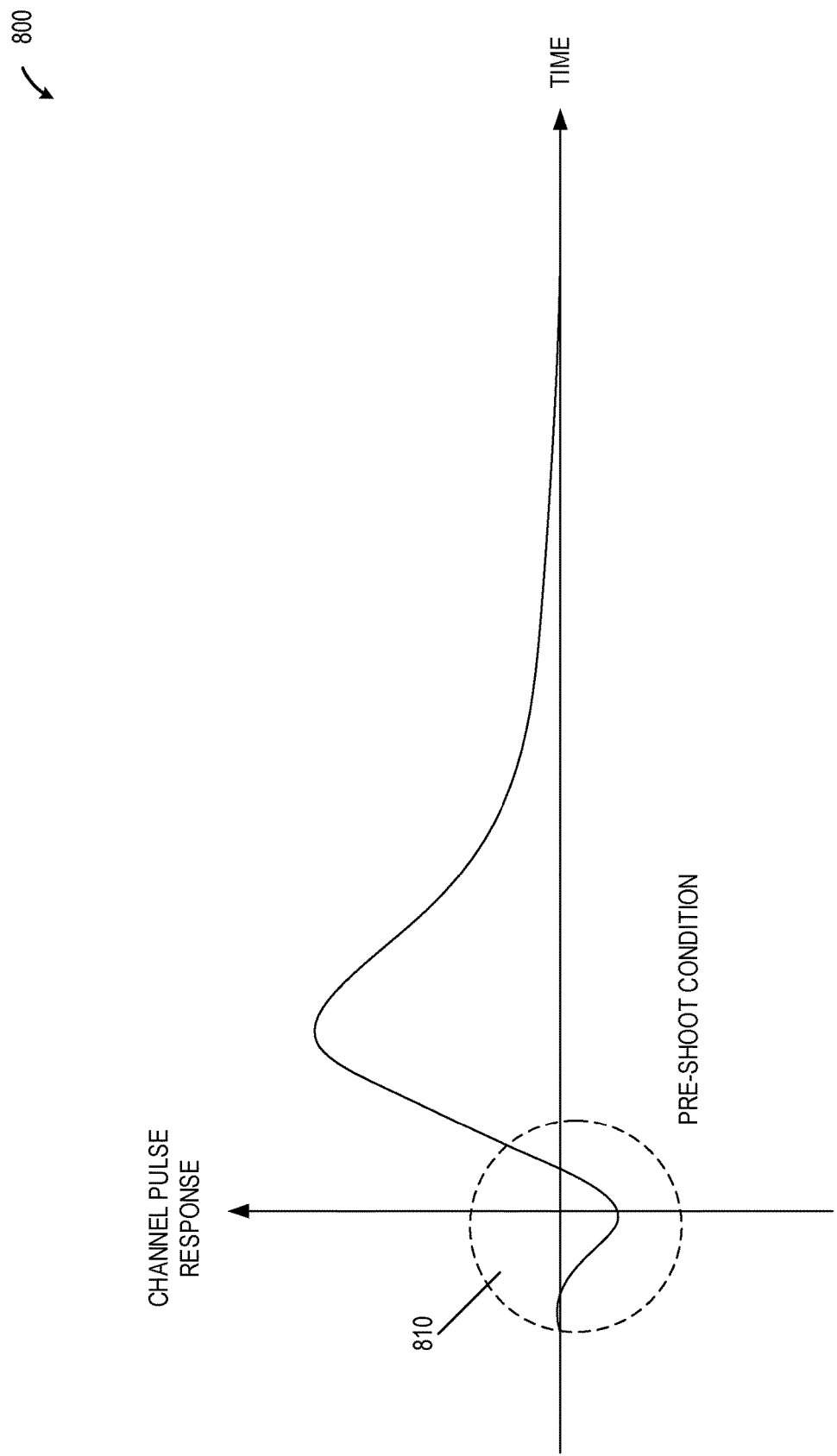
FIG. 8 shows a channel pulse-response graph, according to some embodiments described herein.

FIG. 8 shows a channel pulse-response graph 800, according to some embodiments described herein. Some timing-frequency detectors (e.g., Mueller-Muller phase detectors) require a pre-shoot condition 810 in the system overall pulse response to ensure phase lock. The CDR clock recovery loop in state 720 may rely on TX FFE amplitude tuning to provide this phase lock.

Returning to state 720, the TX FFE may be adapted once in convergence flow 700, as the TX equalizer has an associated has coarse control and cannot be manipulated in data mode. Additionally, the side-channel used to request the link partner to modify the TX FFE does not always exist in data mode, such as the TX FFE in IEEE 802.3 that can be manipulated in training mode but not in data mode. For future communication standards, TX FFE may be modified to include fine resolution, and a side-channel for controlling the link-partner TX FFE may exist in data mode, where it may be possible to adapt TX FFE in subsequent states of convergence flow 700 to further improve equalization. This further equalizer improvement may be beneficial, such as when crosstalk increases when enabling other channels that generate crosstalk or other interference. State 720 may transition to state 730 when the CDR is locked, the TX FFE is stable, the VGA is stable, and the initial signaling constellation is stable.

In state 730, the CTLE is adapted based on a CTLE adaptation algorithm to improve BER and the robustness of the system. Because the CTLE tuning is equivalent to changing a part of the analog channel by multiplying its frequency domain transfer curve with the changing CTLE transfer curve, this CTLE tuning affects the CDR sampling phase and the system gain. States 710 and 720 exhausted link partner and receiver analog equalization capabilities, so what remains of the ISI and interference cannot be optimized further in the analog portions of the equalization system and must be addressed by the digital equalization system. If analog FFE/DFE are implemented instead of or in addition to digital FFE/DFE, the analog FFE/DFE will be adapted in state 740. The CDR input is typically connected before the RX FFE/DFE, so the TX FFE and CTLE are the system elements that affect its performance. Selection of TX FFE and CTLE settings increases the performance of CDR lock, which is provided by the steps in states 710 through 730. This avoids changing CDR lock and CDR performance in state 740 onwards, which may occur if the CDR were to be connected to the output of the RX FFE or DFE. State 730 may transition to state 740 when the CDR is locked, the CTLE is stable, the VGA is stable, and the initial signaling constellation is stable.

In state 740, the RX FFE/DFE are trained. These RX equalizers reduce or eliminate ISI that remains after state 730. If the SERDES convergence circuitry includes a DFE, the system may also be optimized for noise or crosstalk by shifting a balance between CTLE, RX-FFE, and DFE as applicable to reduce BER and increase SNR. Prior to state 720, the ISI is part of the main system pulse response. Additional ISI may be caused by reflections from discontinuities in the channel (e.g., vias, voids in planes), caused by package type (plated through hole (PTH), ball grid array (BGA) breakout, package nonuniformity), or caused by connectors (e.g., stubs, mode conversion, plane transition. This additional ISI may be reduced or eliminated in subsequent states using equalizers within the SERDES convergence circuitry. State 740 may transition to state 750 when the CDR is locked, the VGA is stable, and the RX FFE is stable.

In state 750, a search algorithm may be used to locate tail ISI reflections by scanning the estimated pulse response or individual ISI components. ISI scanning algorithms may be activated to map the location and magnitude of reflections. Because other convergence blocks (e.g., TX FFE, CTLE, FFE, DFE, gain, constellation) may affect the results of the reflection search, the other convergence blocks may be held at fixed values in order to avoid biasing the reflection search. State 750 may transition to state 760 when the CDR is locked, the VGA is stable, the RX FFE is stable, and the reflection search is complete.

In state 760, after locating and selecting the relevant reflections and tail ISI, the system applies FFE/DFE taps at the reflection locations and activates the tail FFE/DFE reflection training. When the SERDES convergence circuitry includes limited tail FFE/DFE resources, these resources are allocated carefully to the reflections that cause the greatest ISI, such as reflections with the greatest magnitude. In state 760, the algorithms described in other steps are also active, so the SERDES convergence circuitry is adaptive, which provides improved performance and stability. State 760 may transition to final state 770 when the CDR is locked, the VGA is stable, the RX FFE is stable, and the tail FFE reflection training is stable.

In state 770, all the control loops speed and gain parameters are optimized and continually updated to track the environmental changes in the system. This ongoing tracking provides improved performance, even when high gain in the control loops raises the chance of multiple loops changing together and resulting in a temporary reduction in BER. In state 770, performance is measured by BER or SNR, and performance is assessed in relation to the standard requirements to determine whether the convergence is successful. The system may remain in state 770 as the system moves from training mode to data mode, and may remain in state 770 as long as the data link is active.

The conditions for transition between states within convergence flow 700 are selected to ensure the control loops enabled in each state are fully stabilized before transitioning to the next state. This confirmation of a stabilized state may include examining the controlled parameters of each control loop and marking the loop as stable when the corresponding parameter stops drifting. For each control loop, different levels of idle transitions may be allowed. In an example, a drift of +/−1 least significant bit in the controlled parameter may be considered stable.

When enabling several control loops in a certain state (e.g., CTLE and FFE tuning enabled at the same time), there may be interaction between the control loops. These interactions may be reduced or eliminated to prevent race conditions or loss of repeatability by selecting different loop gains and different loop bandwidths for each of the enabled control loops to increase predictability of the interactions between loops. These gains may be set separately at each of the convergence states within convergence flow 700 to reduce or eliminate the interactions between loops.

This convergence flow 700 may be implemented in hardware or in firmware. Because convergence flow 700 is not computationally intensive and does not require high-speed responses, convergence flow 700 may be implemented in firmware, which may allow additional flexibility and modifications. When implemented in firmware, hardware accelerators may be used for sensing BER, SNR, residual ISI, or other parameters to provide improved performance over calculating each of these in firmware.

Figure 9:
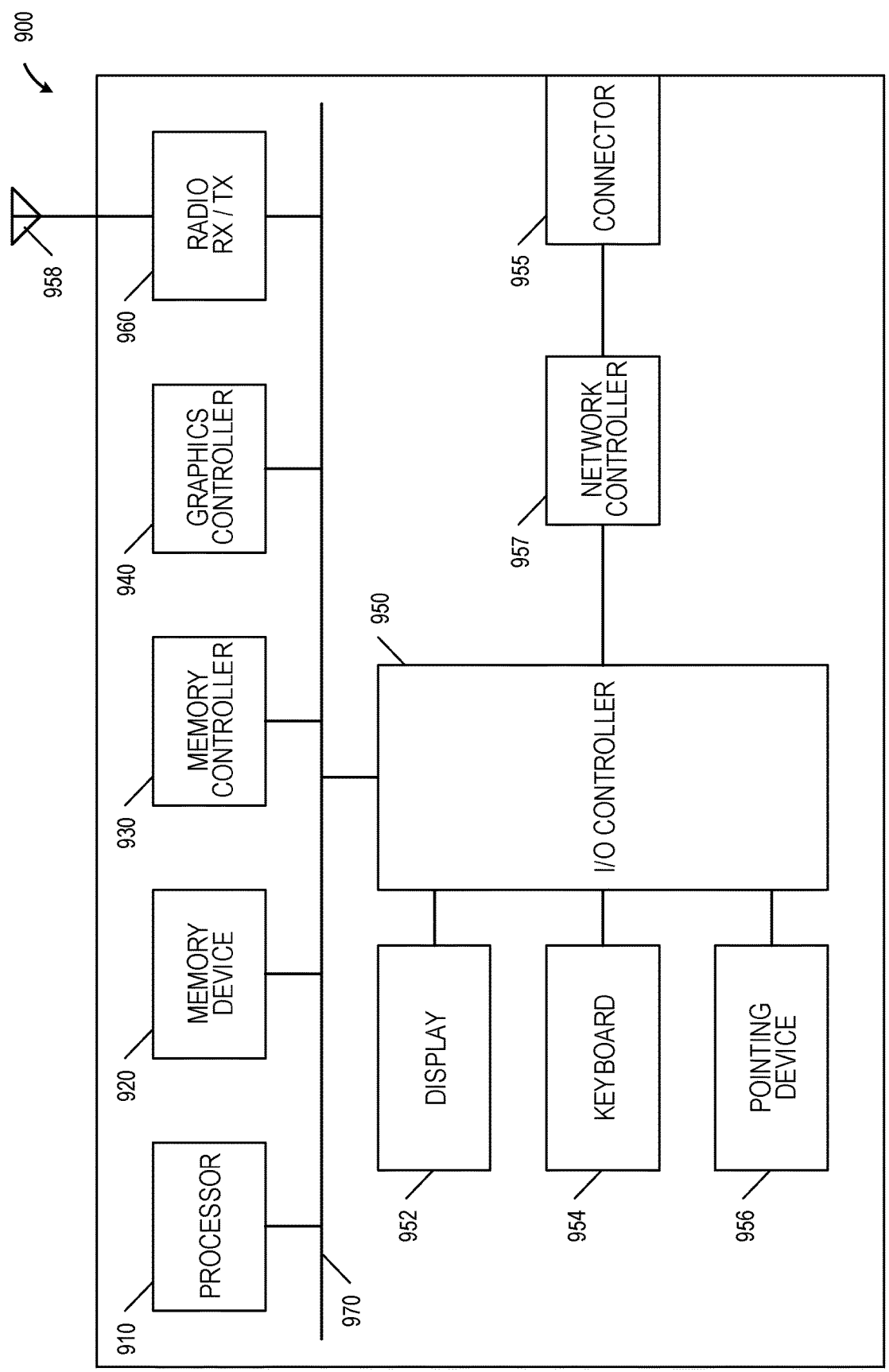
FIG. 9 shows an apparatus in the form of a system, according to some embodiments described herein.

FIG. 9 shows an apparatus in the form of a system (e.g., electronic system) 900, according to some embodiments described herein. System 900 may include or be included in a computer, a tablet, or other electronic system. As shown in FIG. 9, system 900 may include components located on a circuit board (e.g., printed circuit board (PCB)) 902, such as a processor 910, a memory device 920, a memory controller 930, a graphics controller 940, an I/O controller 950, a display 952, a keyboard 954, a pointing device 956, zero or more antennas 958, a radio receiver/transmitter (RX/TX) block 960, a connector 955, and a bus 970. Display 952 may include a liquid crystal display (LCD), a touchscreen (e.g., capacitive or resistive touchscreen), or another type of display. Pointing device 956 may include a mouse, a stylus, or another type of pointing device. Bus 970 may include conductive lines (e.g., metal-based traces on a circuit board where the components of system 900 are located).

Processor 910 may include a general-purpose processor, an application specific integrated circuit (ASIC), or other kinds of processors. Processor 910 may include a CPU.

Memory device 920 may include a dynamic random access memory (DRAM) device, a static random access memory (SRAM) device, a flash memory device, phase change memory, a combination of these memory devices, or other types of memory. FIG. 9 shows an example where memory device 920 is a stand-alone memory device separated from processor 910. In an alternative arrangement, memory device 920 and processor 910 may be located on the same die. In such an alternative arrangement, memory device 920 is an embedded memory in processor 910, such as embedded DRAM (eDRAM), embedded SRAM (eSRAM), embedded flash memory, or another type of embedded memory.

I/O controller 950 may include a communication module for wired or wireless communication (e.g., communication through zero or more antennas 958). Such wireless communication may include communication in accordance with WiFi communication technique, Long Term Evolution Advanced (LTE-A) communication technique, or other communication techniques. I/O controller 950 may also include a module to allow system 900 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 955 may be arranged (e.g., may include terminals, such as pins) to allow system 900 to be coupled through a network controller 957 to an external device (or system). This may allow system 900 to communicate (e.g., exchange information) with such a device (or system) through network controller 957 and through connector 955. Connector 955 and at least a portion of bus 970 may include conductive lines that conform with at least one of USB, DP, HDMI, Thunderbolt, PCIe, Ethernet, and other specifications.

As shown in FIG. 9, each of processor 910, memory device 920, memory controller 930, graphics controller 940, and I/O controller 950 may include the AGC SERDES circuits described above with reference to FIG. 1 through FIG. 5. FIG. 9 shows each of processor 910, memory device 920, memory controller 930, graphics controller 940, and I/O controller 950 including a AGC SERDES circuit, as an example. However, fewer than all of processor 910, memory device 920, memory controller 930, graphics controller 940, and I/O controller 950 may include the AGC SERDES circuit.

FIG. 9 shows the components of system 900 arranged separately from each other as an example. For example, each of processor 910, memory device 920, memory controller 930, graphics controller 940, and I/O controller 950 may be located on a separate IC (e.g., semiconductor die or an IC chip). In some arrangements, two or more components (e.g., processor 910, memory device 920, graphics controller 940, and I/O controller 950) of system 900 may be located on the same die (e.g., same IC chip) that may be part of a system on chip, a system in a package, or other electronic devices or systems.

The illustrations of the AGC SERDES circuit described above are intended to provide a general understanding of the structure of different embodiments, and are not intended to provide a complete description of all the elements and features of an apparatus that might make use of the structures described herein. In some arrangements, system 900 does not have to include a display. Thus, display 952 may be omitted from system 900. In some arrangements, system 900 does not have to include any antenna. Thus, antenna 958 and radio RX/TX block 960 may be omitted from system 900. In some arrangements, system 900 does not have to include a connector. Thus, connector 955 or network controller 957 may be omitted from system 900.

The apparatuses and methods described above may include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" may mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A may include a single element or multiple elements. Item B may include a single element or multiple elements. Item C may include a single element or multiple elements.

In the detailed description and the claims, a list of items joined by the term "one of" may mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A may include a single element or multiple elements. Item B may include a single element or multiple elements. Item C may include a single element or multiple elements.

Additional Notes and Examples

Example 1 is an apparatus comprising: an analog receiver to generate an analog-to-digital converter (ADC) digital signal based on a received analog input signal; a data path circuit including: a digitally controlled equalizer to generate a digitally equalized signal based on the ADC digital signal and a plurality of equalizer coefficients; and a slicer to generate a sliced data stream and a sliced error stream based on the digitally equalized signal; and a digital signal processing (DSP) circuit to generate a converged data stream output and the plurality of equalizer coefficients based on the sliced data stream and the sliced error stream; wherein the slicer is further to generate a gain-controlled data stream and a gain-controlled sliced error stream based on a slicer reference level, the slicer reference level generated based on the plurality of equalizer coefficients.

In Example 2, the subject matter of Example 1 includes, a slicer reference level circuit, the slicer reference level circuit including: a magnitude summation circuit to generate a coefficient magnitude sum based on the plurality of equalizer coefficients; a multiplier circuit to generate a multiplier saturation output based on the coefficient magnitude sum and a previous slicer level; a comparator circuit to generate a saturation prevention request based on the multiplier saturation output and a saturation limit input; and a reference level accumulator circuit to generate the slicer reference level based on the saturation prevention request.

In Example 3, the subject matter of Example 2 includes, wherein: the saturation prevention request includes an increase request when the comparator circuit determines the multiplier saturation output is greater than the saturation limit input; the saturation prevention request includes a decrease request when the comparator circuit determines the multiplier saturation output is less than the saturation limit input; and the saturation prevention request includes a hold request when the comparator circuit determines the multiplier saturation output is substantially equal to the saturation limit input.

In Example 4, the subject matter of Example 3 includes, wherein the slicer reference level is initialized to be substantially equal to the saturation limit input.

In Example 5, the subject matter of Examples 3-4 includes, wherein each of the plurality of equalizer coefficients are initialized to zero.

In Example 6, the subject matter of Examples 2-5 includes, wherein the magnitude summation circuit uses fewer than all available equalizer coefficients within the plurality of equalizer coefficients.

In Example 7, the subject matter of Example 6 includes, wherein a number of used equalizer coefficients is selected based on a desired bit error rate (BER).

In Example 8, the subject matter of Examples 1-7 includes, wherein the DSP circuit is further to initiate a first convergence state, the first convergence state including: locking a reference clock timebase to an analog input signal timebase; and sending a plurality of analog initialization values to the analog receiver.

In Example 9, the subject matter of Example 8 includes, wherein locking the reference clock timebase includes: generating a reference clock signal at the DSP circuit; generating an oscillator signal at an oscillator circuit based on the reference clock signal; and generating the ADC digital signal at an ADC circuit within the analog receiver based on the oscillator signal.

In Example 10, the subject matter of Example 9 includes, wherein the oscillator includes at least one of a voltage controlled oscillator (VCO) and a digitally controlled oscillator (DCO).

In Example 11, the subject matter of Examples 9-10 includes, wherein sending the plurality of analog initialization values to the analog receiver includes: sending a continuous time linear equalizer (CTLE) initialization to a CTLE circuit; and sending a variable gain amplifier (VGA) initialization to a VGA circuit.

In Example 12, the subject matter of Example 11 includes, wherein the DSP circuit is further to initiate a second convergence state subsequent to the first convergence state, the second convergence state including a clock and data recovery (CDR) to lock on a plurality of data transitions within the ADC digital signal.

In Example 13, the subject matter of Example 12 includes, wherein the DSP circuit is further to initiate a third convergence state subsequent to the second convergence state, the third convergence state including tuning the CTLE circuit.

In Example 14, the subject matter of Example 13 includes, wherein the DSP circuit is further to initiate a fourth convergence state subsequent to the third convergence state, the fourth convergence state including training the digitally controlled equalizer to reduce a bit error rate (BER) and increase a signal-to-noise ratio (SNR) of the digitally equalized signal generated by the digitally controlled equalizer.

In Example 15, the subject matter of Example 14 includes, wherein the DSP circuit is further to initiate a fifth convergence state subsequent to the fourth convergence state, the fifth convergence state including identifying a location and a magnitude associated with each of plurality of reflections within the digitally equalized signal.

In Example 16, the subject matter of Example 15 includes, wherein the DSP circuit is further to initiate a sixth convergence state subsequent to the fifth convergence state, the sixth convergence state including application of equalizer taps at the location and the magnitude associated with each of plurality of reflections within the digitally equalized signal.

In Example 17, the subject matter of Example 16 includes, wherein the DSP circuit is further to initiate a seventh convergence state subsequent to the sixth convergence state, the seventh convergence state including monitoring a convergence based on the BER and the SNR of the digitally equalized signal.

In Example 18, the subject matter of Examples 1-17 includes, wherein the DSP circuit is further to initiate a first convergence state, the first convergence state including: locking a reference clock timebase to an analog input signal timebase, the locking including: generating a reference clock signal at the DSP circuit; generating an oscillator signal at an oscillator circuit based on the reference clock signal; and generating the ADC digital signal at an ADC circuit within the analog receiver based on the oscillator signal; and sending a plurality of analog initialization values to the analog receiver, the sending including: sending a continuous time linear equalizer (CTLE) initialization to a CTLE circuit; and sending a variable gain amplifier (VGA) initialization to a VGA circuit.

In Example 19, the subject matter of Example 18 includes, wherein the DSP circuit is further to: initiate a second convergence state subsequent to the first convergence state, the second convergence state including a clock and data recovery (CDR) to lock on a plurality of data transitions within the ADC digital signal; initiate a third convergence state subsequent to the second convergence state, the third convergence state including tuning the CTLE circuit; including initiate a fourth convergence state subsequent to the third convergence state, the fourth convergence state including training the digitally controlled equalizer to reduce a bit error rate (BER) and increase a signal-to-noise ratio (SNR) of the digitally equalized signal generated by the digitally controlled equalizer; initiate a fifth convergence state subsequent to the fourth convergence state, the fifth convergence state including identifying a location and a magnitude associated with each of plurality of reflections within the digitally equalized signal; initiate a sixth convergence state subsequent to the fifth convergence state, the sixth convergence state including application of equalizer taps at the location and the magnitude associated with each of plurality of reflections within the digitally equalized signal; and initiate a seventh convergence state subsequent to the sixth convergence state, the seventh convergence state including monitoring a convergence based on the BER and the SNR of the digitally equalized signal.

Example 20 is a method comprising: generating an analog-to-digital converter (ADC) digital signal at an analog receiver based on a received analog input signal; generating a digitally equalized signal at a digitally controlled equalizer within a data path circuit, the digitally equalized signal generated based on the ADC digital signal and a plurality of equalizer coefficients; and generating a sliced data stream and a sliced error stream at a slicer within the data path circuit, the sliced data stream and a sliced error stream generated based on the digitally equalized signal; generating a converged data stream output and the plurality of equalizer coefficients at a digital signal processing (DSP) circuit, the converged data stream output and the plurality of equalizer coefficients generated based on the sliced data stream and the sliced error stream; and generating a gain-controlled data stream and a gain-controlled sliced error stream at the slicer based on a slicer reference level, the slicer reference level generated based on the plurality of equalizer coefficients.

In Example 21, the subject matter of Example 20 includes, generating a coefficient magnitude sum at a magnitude summation circuit based on the plurality of equalizer coefficients; generating a multiplier saturation output at a multiplier circuit based on the coefficient magnitude sum and a previous slicer level; generating a saturation prevention at a comparator circuit request based on the multiplier saturation output and a saturation limit input; and generating the slicer reference level at a reference level accumulator circuit based on the saturation prevention request.

In Example 22, the subject matter of Example 21 includes, wherein: the saturation prevention request includes an increase request when the comparator circuit determines the multiplier saturation output is greater than the saturation limit input; the saturation prevention request includes a decrease request when the comparator circuit determines the multiplier saturation output is less than the saturation limit input; and the saturation prevention request includes a hold request when the comparator circuit determines the multiplier saturation output is substantially equal to the saturation limit input.

In Example 23, the subject matter of Example 22 includes, wherein the slicer reference level is initialized to be substantially equal to the saturation limit input.

In Example 24, the subject matter of Examples 22-23 includes, wherein each of the plurality of equalizer coefficients are initialized to zero.

In Example 25, the subject matter of Examples 21-24 includes, wherein generating the coefficient magnitude sum at the magnitude summation circuit is based on fewer than all available equalizer coefficients within the plurality of equalizer coefficients.

In Example 26, the subject matter of Example 25 includes, wherein a number of used equalizer coefficients is selected based on a desired bit error rate (BER).

In Example 27, the subject matter of Examples 20-26 includes, initiating a first convergence state at the DSP circuit, the first convergence state including: locking a reference clock timebase to an analog input signal timebase; and sending a plurality of analog initialization values to the analog receiver.

In Example 28, the subject matter of Example 27 includes, wherein locking the reference clock timebase includes: generating a reference clock signal at the DSP circuit; generating an oscillator signal at an oscillator circuit based on the reference clock signal; and generating the ADC digital signal at an ADC circuit within the analog receiver based on the oscillator signal.

In Example 29, the subject matter of Example 28 includes, wherein the oscillator includes at least one of a voltage controlled oscillator (VCO) and a digitally controlled oscillator (DCO).

In Example 30, the subject matter of Examples 28-29 includes, wherein sending the plurality of analog initialization values to the analog receiver includes: sending a continuous time linear equalizer (CTLE) initialization to a CTLE circuit; and sending a variable gain amplifier (VGA) initialization to a VGA circuit.

In Example 31, the subject matter of Example 30 includes, initiating a second convergence state subsequent to the first convergence state, the second convergence state including a clock and data recovery (CDR) to lock on a plurality of data transitions within the ADC digital signal.

In Example 32, the subject matter of Example 31 includes, initiating a third convergence state subsequent to the second convergence state, the third convergence state including tuning the CTLE circuit.

In Example 33, the subject matter of Example 32 includes, initiating a fourth convergence state subsequent to the third convergence state, the fourth convergence state including training the digitally controlled equalizer to reduce a bit error rate (BER) and increase a signal-to-noise ratio (SNR) of the digitally equalized signal generated by the digitally controlled equalizer.

In Example 34, the subject matter of Example 33 includes, initiating a fifth convergence state subsequent to the fourth convergence state, the fifth convergence state including identifying a location and a magnitude associated with each of plurality of reflections within the digitally equalized signal.

In Example 35, the subject matter of Example 34 includes, initiating a sixth convergence state subsequent to the fifth convergence state, the sixth convergence state including application of equalizer taps at the location and the magnitude associated with each of plurality of reflections within the digitally equalized signal.

In Example 36, the subject matter of Example 35 includes, initiating a seventh convergence state subsequent to the sixth convergence state, the seventh convergence state including monitoring a convergence based on the BER and the SNR of the digitally equalized signal.

In Example 37, the subject matter of Examples 20-36 includes, initiating a first convergence state at the DSP circuit, the first convergence state including: locking a reference clock timebase to an analog input signal timebase, the locking including: generating a reference clock signal at the DSP circuit; generating an oscillator signal at an oscillator circuit based on the reference clock signal; and generating the ADC digital signal at an ADC circuit within the analog receiver based on the oscillator signal; and sending a plurality of analog initialization values to the analog receiver, the sending including: sending a continuous time linear equalizer (CTLE) initialization to a CTLE circuit; and sending a variable gain amplifier (VGA) initialization to a VGA circuit.

In Example 38, the subject matter of Example 37 includes, initiating a second convergence state subsequent to the first convergence state, the second convergence state including a clock and data recovery (CDR) to lock on a plurality of data transitions within the ADC digital signal; initiating a third convergence state subsequent to the second convergence state, the third convergence state including tuning the CTLE circuit; including initiating a fourth convergence state subsequent to the third convergence state, the fourth convergence state including training the digitally controlled equalizer to reduce a bit error rate (BER) and increase a signal-to-noise ratio (SNR) of the digitally equalized signal generated by the digitally controlled equalizer; initiating a fifth convergence state subsequent to the fourth convergence state, the fifth convergence state including identifying a location and a magnitude associated with each of plurality of reflections within the digitally equalized signal; initiating a sixth convergence state subsequent to the fifth convergence state, the sixth convergence state including application of equalizer taps at the location and the magnitude associated with each of plurality of reflections within the digitally equalized signal; and initiating a seventh convergence state subsequent to the sixth convergence state, the seventh convergence state including monitoring a convergence based on the BER and the SNR of the digitally equalized signal.

Example 39 is an apparatus comprising: a serializer/deserializer (SERDES) receiver to generate a gain-controlled SERDES signal based on an analog input signal received from a SERDES transmitter circuit, the SERDES receiver including: an analog receiver to generate an analog-to-digital converter (ADC) digital signal based on a received analog input signal; a data path circuit including: a digitally controlled equalizer to generate a digitally equalized signal based on the ADC digital signal and a plurality of equalizer coefficients; and a slicer to generate a sliced data stream and a sliced error stream based on the digitally equalized signal; and a digital signal processing (DSP) circuit to generate a converged data stream output and the plurality of equalizer coefficients based on the sliced data stream and the sliced error stream; wherein the slicer is further to generate a gain-controlled data stream and a gain-controlled sliced error stream based on a slicer reference level, the slicer reference level generated based on the plurality of equalizer coefficients.

In Example 40, the subject matter of Example 39 includes, a slicer reference level circuit, the slicer reference level circuit including: a magnitude summation circuit to generate a coefficient magnitude sum based on the plurality of equalizer coefficients; a multiplier circuit to generate a multiplier saturation output based on the coefficient magnitude sum and a previous slicer level; a comparator circuit to generate a saturation prevention request based on the multiplier saturation output and a saturation limit input; and a reference level accumulator circuit to generate the slicer reference level based on the saturation prevention request.

In Example 41, the subject matter of Example 40 includes, wherein: the saturation prevention request includes an increase request when the comparator circuit determines the multiplier saturation output is greater than the saturation limit input; the saturation prevention request includes a decrease request when the comparator circuit determines the multiplier saturation output is less than the saturation limit input; and the saturation prevention request includes a hold request when the comparator circuit determines the multiplier saturation output is substantially equal to the saturation limit input.

In Example 42, the subject matter of Example 41 includes, wherein the slicer reference level is initialized to be substantially equal to the saturation limit input.

In Example 43, the subject matter of Examples 41-42 includes, wherein each of the plurality of equalizer coefficients are initialized to zero.

In Example 44, the subject matter of Examples 40-43 includes, wherein the magnitude summation circuit uses fewer than all available equalizer coefficients within the plurality of equalizer coefficients.

In Example 45, the subject matter of Example 44 includes, wherein a number of used equalizer coefficients is selected based on a desired bit error rate (BER).

In Example 46, the subject matter of Examples 39-45 includes, wherein the DSP circuit is further to initiate a first convergence state, the first convergence state including: locking a reference clock timebase to an analog input signal timebase; and sending a plurality of analog initialization values to the analog receiver.

In Example 47, the subject matter of Example 46 includes, wherein locking the reference clock timebase includes: generating a reference clock signal at the DSP circuit; generating an oscillator signal at an oscillator circuit based on the reference clock signal; and generating the ADC digital signal at an ADC circuit within the analog receiver based on the oscillator signal.

In Example 48, the subject matter of Example 47 includes, wherein the oscillator includes at least one of a voltage controlled oscillator (VCO) and a digitally controlled oscillator (DCO).

In Example 49, the subject matter of Examples 47-48 includes, wherein sending the plurality of analog initialization values to the analog receiver includes: sending a continuous time linear equalizer (CTLE) initialization to a CTLE circuit; and sending a variable gain amplifier (VGA) initialization to a VGA circuit.

In Example 50, the subject matter of Example 49 includes, wherein the DSP circuit is further to initiate a second convergence state subsequent to the first convergence state, the second convergence state including a clock and data recovery (CDR) to lock on a plurality of data transitions within the ADC digital signal.

In Example 51, the subject matter of Example 50 includes, wherein the DSP circuit is further to initiate a third convergence state subsequent to the second convergence state, the third convergence state including tuning the CTLE circuit.

In Example 52, the subject matter of Example 51 includes, wherein the DSP circuit is further to initiate a fourth convergence state subsequent to the third convergence state, the fourth convergence state including training the digitally controlled equalizer to reduce a bit error rate (BER) and increase a signal-to-noise ratio (SNR) of the digitally equalized signal generated by the digitally controlled equalizer.

In Example 53, the subject matter of Example 52 includes, wherein the DSP circuit is further to initiate a fifth convergence state subsequent to the fourth convergence state, the fifth convergence state including identifying a location and a magnitude associated with each of plurality of reflections within the digitally equalized signal.

In Example 54, the subject matter of Example 53 includes, wherein the DSP circuit is further to initiate a sixth convergence state subsequent to the fifth convergence state, the sixth convergence state including application of equalizer taps at the location and the magnitude associated with each of plurality of reflections within the digitally equalized signal.

In Example 55, the subject matter of Example 54 includes, wherein the DSP circuit is further to initiate a seventh convergence state subsequent to the sixth convergence state, the seventh convergence state including monitoring a convergence based on the BER and the SNR of the digitally equalized signal.

In Example 56, the subject matter of Examples 39-55 includes, wherein the DSP circuit is further to initiate a first convergence state, the first convergence state including: locking a reference clock timebase to an analog input signal timebase, the locking including: generating a reference clock signal at the DSP circuit; generating an oscillator signal at an oscillator circuit based on the reference clock signal; and generating the ADC digital signal at an ADC circuit within the analog receiver based on the oscillator signal; and sending a plurality of analog initialization values to the analog receiver, the sending including: sending a continuous time linear equalizer (CTLE) initialization to a CTLE circuit; and sending a variable gain amplifier (VGA) initialization to a VGA circuit.

In Example 57, the subject matter of Example 56 includes, wherein the DSP circuit is further to: initiate a second convergence state subsequent to the first convergence state, the second convergence state including a clock and data recovery (CDR) to lock on a plurality of data transitions within the ADC digital signal; initiate a third convergence state subsequent to the second convergence state, the third convergence state including tuning the CTLE circuit; including initiate a fourth convergence state subsequent to the third convergence state, the fourth convergence state including training the digitally controlled equalizer to reduce a bit error rate (BER) and increase a signal-to-noise ratio (SNR) of the digitally equalized signal generated by the digitally controlled equalizer; initiate a fifth convergence state subsequent to the fourth convergence state, the fifth convergence state including identifying a location and a magnitude associated with each of plurality of reflections within the digitally equalized signal; initiate a sixth convergence state subsequent to the fifth convergence state, the sixth convergence state including application of equalizer taps at the location and the magnitude associated with each of plurality of reflections within the digitally equalized signal; and initiate a seventh convergence state subsequent to the sixth convergence state, the seventh convergence state including monitoring a convergence based on the BER and the SNR of the digitally equalized signal.

Example 58 is at least one machine-readable medium including instructions that, when executed by processing circuitry, cause the processing circuitry to perform operations to implement of any of Examples 1-57.

Example 59 is an apparatus comprising means to implement of any of Examples 1-57.

Example 60 is a system to implement of any of Examples 1-57.

Example 61 is a method to implement of any of Examples 1-57.

The subject matter of Example 1 through Example 57 may be combined in any combination.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
an analog receiver to generate an analog-to-digital converter (ADC) digital signal based on a received analog input signal;
a data path circuit including:
a digitally controlled equalizer to generate a digitally equalized signal based on the ADC digital signal and a plurality of equalizer coefficients; and
a slicer to generate a sliced data stream and a sliced error stream based on the digitally equalized signal; and
a digital signal processing (DSP) circuit to generate a converged data stream output and the plurality of equalizer coefficients based on the sliced data stream and the sliced error stream;
wherein the slicer is further to generate a gain-controlled data stream and a gain-controlled sliced error stream based on a slicer reference level, the slicer reference level generated based on the plurality of equalizer coefficients.

2. The apparatus of claim 1, further including a slicer reference level circuit, the slicer reference level circuit including:
a magnitude summation circuit to generate a coefficient magnitude sum based on the plurality of equalizer coefficients;
a multiplier circuit to generate a multiplier saturation output based on the coefficient magnitude sum and a previous slicer level;
a comparator circuit to generate a saturation prevention request based on the multiplier saturation output and a saturation limit input; and
a reference level accumulator circuit to generate the slicer reference level based on the saturation prevention request.

3. The apparatus of claim 2, wherein:
the saturation prevention request includes an increase request when the comparator circuit determines the multiplier saturation output is greater than the saturation limit input;
the saturation prevention request includes a decrease request when the comparator circuit determines the multiplier saturation output is less than the saturation limit input; and
the saturation prevention request includes a hold request when the comparator circuit determines the multiplier saturation output is substantially equal to the saturation limit input.

4. The apparatus of claim 3, wherein the slicer reference level is initialized to be substantially equal to the saturation limit input.

5. The apparatus of claim 3, wherein each of the plurality of equalizer coefficients are initialized to zero.

6. The apparatus of claim 2, wherein the magnitude summation circuit uses fewer than all available equalizer coefficients within the plurality of equalizer coefficients.

7. The apparatus of claim 6, wherein a number of used equalizer coefficients is selected based on a desired bit error rate (BER).

8. The apparatus of claim 1, wherein the DSP circuit is further to initiate a first convergence state, the first convergence state including:
locking a reference clock timebase to an analog input signal timebase, the locking including:
generating a reference clock signal at the DSP circuit;
generating an oscillator signal at an oscillator circuit based on the reference clock signal; and
generating the ADC digital signal at an ADC circuit within the analog receiver based on the oscillator signal; and
sending a plurality of analog initialization values to the analog receiver, the sending including:
sending a continuous time linear equalizer (CTLE) initialization to a CTLE circuit; and
sending a variable gain amplifier (VGA) initialization to a VGA circuit.

9. The apparatus of claim 8, wherein the DSP circuit is further to:
initiate a second convergence state subsequent to the first convergence state, the second convergence state including a clock and data recovery (CDR) to lock on a plurality of data transitions within the ADC digital signal;
initiate a third convergence state subsequent to the second convergence state, the third convergence state including tuning the CTLE circuit;
including initiate a fourth convergence state subsequent to the third convergence state, the fourth convergence state including training the digitally controlled equalizer to reduce a bit error rate (BER) and increase a signal-to-noise ratio (SNR) of the digitally equalized signal generated by the digitally controlled equalizer;
initiate a fifth convergence state subsequent to the fourth convergence state, the fifth convergence state including identifying a location and a magnitude associated with each of plurality of reflections within the digitally equalized signal;
initiate a sixth convergence state subsequent to the fifth convergence state, the sixth convergence state including application of equalizer taps at the location and the magnitude associated with each of plurality of reflections within the digitally equalized signal; and
initiate a seventh convergence state subsequent to the sixth convergence state, the seventh convergence state including monitoring a convergence based on the BER and the SNR of the digitally equalized signal.

10. A method comprising:
generating an analog-to-digital converter (ADC) digital signal at an analog receiver based on a received analog input signal;
generating a digitally equalized signal at a digitally controlled equalizer within a data path circuit, the digitally equalized signal generated based on the ADC digital signal and a plurality of equalizer coefficients; and
generating a sliced data stream and a sliced error stream at a slicer within the data path circuit, the sliced data stream and a sliced error stream generated based on the digitally equalized signal;
generating a converged data stream output and the plurality of equalizer coefficients at a digital signal processing (DSP) circuit, the converged data stream output and the plurality of equalizer coefficients generated based on the sliced data stream and the sliced error stream; and
generating a gain-controlled data stream and a gain-controlled sliced error stream at the slicer based on a slicer reference level, the slicer reference level generated based on the plurality of equalizer coefficients.

11. The method of claim 10, further including:
generating a coefficient magnitude sum at a magnitude summation circuit based on the plurality of equalizer coefficients;
generating a multiplier saturation output at a multiplier circuit based on the coefficient magnitude sum and a previous slicer level;
generating a saturation prevention at a comparator circuit request based on the multiplier saturation output and a saturation limit input; and
generating the slicer reference level at a reference level accumulator circuit based on the saturation prevention request.

12. The method of claim 11, wherein:
the saturation prevention request includes an increase request when the comparator circuit determines the multiplier saturation output is greater than the saturation limit input;
the saturation prevention request includes a decrease request when the comparator circuit determines the multiplier saturation output is less than the saturation limit input; and
the saturation prevention request includes a hold request when the comparator circuit determines the multiplier saturation output is substantially equal to the saturation limit input.

13. The method of claim 12, wherein the slicer reference level is initialized to be substantially equal to the saturation limit input.

14. The method of claim 12, wherein each of the plurality of equalizer coefficients are initialized to zero.

15. The method of claim 11, wherein generating the coefficient magnitude sum at the magnitude summation circuit is based on fewer than all available equalizer coefficients within the plurality of equalizer coefficients.

16. The method of claim 15, wherein a number of used equalizer coefficients is selected based on a desired bit error rate (BER).

17. The method of claim 10, further including initiating a first convergence state at the DSP circuit, the first convergence state including:
locking a reference clock timebase to an analog input signal timebase, the locking including:
generating a reference clock signal at the DSP circuit;
generating an oscillator signal at an oscillator circuit based on the reference clock signal; and
generating the ADC digital signal at an ADC circuit within the analog receiver based on the oscillator signal; and
sending a plurality of analog initialization values to the analog receiver, the sending including:
sending a continuous time linear equalizer (CTLE) initialization to a CTLE circuit; and
sending a variable gain amplifier (VGA) initialization to a VGA circuit.

18. The method of claim 17, further including:
initiating a second convergence state subsequent to the first convergence state, the second convergence state including a clock and data recovery (CDR) to lock on a plurality of data transitions within the ADC digital signal;
initiating a third convergence state subsequent to the second convergence state, the third convergence state including tuning the CTLE circuit;
including initiating a fourth convergence state subsequent to the third convergence state, the fourth convergence state including training the digitally controlled equalizer to reduce a bit error rate (BER) and increase a signal-to-noise ratio (SNR) of the digitally equalized signal generated by the digitally controlled equalizer;
initiating a fifth convergence state subsequent to the fourth convergence state, the fifth convergence state including identifying a location and a magnitude associated with each of plurality of reflections within the digitally equalized signal;
initiating a sixth convergence state subsequent to the fifth convergence state, the sixth convergence state including application of equalizer taps at the location and the magnitude associated with each of plurality of reflections within the digitally equalized signal; and
initiating a seventh convergence state subsequent to the sixth convergence state, the seventh convergence state including monitoring a convergence based on the BER and the SNR of the digitally equalized signal.

19. An apparatus comprising:
a serializer/deserializer (SERDES) receiver to generate a gain-controlled SERDES signal based on an analog input signal received from a SERDES transmitter circuit, the SERDES receiver including:
an analog receiver to generate an analog-to-digital converter (ADC) digital signal based on a received analog input signal;
a data path circuit including:
a digitally controlled equalizer to generate a digitally equalized signal based on the ADC digital signal and a plurality of equalizer coefficients; and
a slicer to generate a sliced data stream and a sliced error stream based on the digitally equalized signal; and
a digital signal processing (DSP) circuit to generate a converged data stream output and the plurality of equalizer coefficients based on the sliced data stream and the sliced error stream;
wherein the slicer is further to generate a gain-controlled data stream and a gain-controlled sliced error stream based on a slicer reference level, the slicer reference level generated based on the plurality of equalizer coefficients.

20. The apparatus of claim 19, further including a slicer reference level circuit, the slicer reference level circuit including:
a magnitude summation circuit to generate a coefficient magnitude sum based on the plurality of equalizer coefficients;
a multiplier circuit to generate a multiplier saturation output based on the coefficient magnitude sum and a previous slicer level;
a comparator circuit to generate a saturation prevention request based on the multiplier saturation output and a saturation limit input; and
a reference level accumulator circuit to generate the slicer reference level based on the saturation prevention request.

21. The apparatus of claim 20, wherein:
the saturation prevention request includes an increase request when the comparator circuit determines the multiplier saturation output is greater than the saturation limit input;

the saturation prevention request includes a decrease request when the comparator circuit determines the multiplier saturation output is less than the saturation limit input; and the saturation prevention request includes a hold request when the comparator circuit determines the multiplier saturation output is substantially equal to the saturation limit input.

22. The apparatus of claim 21, wherein the slicer reference level is initialized to be substantially equal to the saturation limit input.

23. The apparatus of claim 21, wherein each of the plurality of equalizer coefficients are initialized to zero.

24. The apparatus of claim 20, wherein the magnitude summation circuit uses fewer than all available equalizer coefficients within the plurality of equalizer coefficients.

25. The apparatus of claim 24, wherein a number of used equalizer coefficients is selected based on a desired bit error rate (BER).

* * * * *